(12) United States Patent
Hong

(10) Patent No.: US 9,070,726 B2
(45) Date of Patent: Jun. 30, 2015

(54) TEMPERATURE CONTROL METHOD OF CHEMICAL VAPOR DEPOSITION DEVICE

(75) Inventor: Sung Jae Hong, Gyeonggi-do (KR)

(73) Assignee: LIGADP CO., LTD., Gyeonggi-do (KR)

( * ) Notice: Subject to any disclaimer, the term of this patent is extended or adjusted under 35 U.S.C. 154(b) by 557 days.

(21) Appl. No.: 13/505,290

(22) PCT Filed: Nov. 2, 2009

(86) PCT No.: PCT/KR2009/006388
§ 371 (c)(1),
(2), (4) Date: May 1, 2012

(87) PCT Pub. No.: WO2011/052831
PCT Pub. Date: May 5, 2011

(65) Prior Publication Data
US 2012/0221167 A1    Aug. 30, 2012

(51) Int. Cl.
G05D 23/19    (2006.01)
H01L 21/67    (2006.01)
C23C 16/46    (2006.01)
C23C 16/52    (2006.01)

(52) U.S. Cl.
CPC .......... *H01L 21/67248* (2013.01); *C23C 16/46* (2013.01); *C23C 16/52* (2013.01)

(58) Field of Classification Search
CPC .... H01L 21/67248; C23C 16/46; C23C 16/52
USPC ........................................................ 700/300
See application file for complete search history.

(56) References Cited

U.S. PATENT DOCUMENTS 6,022,413 A * 2/2000 Shinozaki et al. ............ 118/715
6,032,724 A * 3/2000 Hatta .......................... 165/80.2
(Continued)

FOREIGN PATENT DOCUMENTS

CN    1841654 A    10/2006
JP    2000-306850 A    11/2000
(Continued)

OTHER PUBLICATIONS

Extended European Search Report issued Jun. 24, 2013 in corresponding EPO application No. 09850902.9 (6 pages).
(Continued)

*Primary Examiner* — Kenneth Lo
*Assistant Examiner* — Derrick Boateng
(74) *Attorney, Agent, or Firm* — Osha Liang LLP

(57) ABSTRACT

A temperature control method of a chemical vapor deposition device including: a chamber; a susceptor positioned on the inner side of the chamber allowing rotation therein, a wafer stacked on an upper side; a gas supplier disposed on the inner side of the chamber, and sprays gas toward the wafer; a heater disposed on the inner side of the susceptor, and heats the wafer; and a temperature sensor positioned in the chamber, and measures the temperature. The temperature control method includes: (a) calculating the temperature distribution of the susceptor based on a measured value of the temperature sensor, and dividing a section with relatively high temperature as a susceptor section and a section with relatively low temperature as a wafer section from the temperature distribution; and (b) controlling the heater by comparing a reference temperature with the temperature of a selected position of the susceptor section or the wafer section.

17 Claims, 13 Drawing Sheets

(56) References Cited

U.S. PATENT DOCUMENTS

| | | | |
|---|---|---|---|
| 6,250,914 B1 | 6/2001 | Katsumata et al. | |
| 6,364,949 B1 * | 4/2002 | Or et al. | 118/69 |
| 6,610,968 B1 * | 8/2003 | Shajii et al. | 219/497 |
| 2002/0113060 A1 * | 8/2002 | Sandhu | 219/497 |
| 2003/0029381 A1 | 2/2003 | Nishibayashi | |
| 2003/0233768 A1 * | 12/2003 | Kaeppeler | 34/560 |
| 2007/0292598 A1 * | 12/2007 | Tada et al. | 427/8 |
| 2010/0111511 A1 * | 5/2010 | Merry et al. | 392/411 |

FOREIGN PATENT DOCUMENTS

| | | |
|---|---|---|
| JP | 2001-185490 A | 7/2001 |
| KR | 10-0481113 B1 | 3/2005 |
| KR | 10-0676404 B1 | 1/2007 |
| KR | 10-0803187 B1 | 2/2008 |
| KR | 10-0905897 B1 | 6/2009 |
| KR | 10-1047823 B1 | 7/2011 |
| WO | 02/26435 A1 | 4/2002 |
| WO | 0227059 A2 | 4/2002 |

OTHER PUBLICATIONS

International Search Report w/translation from PCT/KR2009/006388 dated Jul. 27, 2010 (4 pages).
Korean Patent Abstract Publication No. 1020010062124A dated Jul. 7, 2001 (2 pages).
Korean Patent Abstract Publication No. 1020060106736A dated Oct. 12, 2006 (2 pages).
Korean Patent Abstract Publication No. 1020030033068A dated Apr. 26, 2003 (2 pages).
Korean Patent Abstract Publication No. 1020010014796A dated Feb. 26, 2001 (2 pages).
Korean Patent Abstract Publication No. 1020050106457A dated Nov. 9, 2005 (2 pages).
Communication pursuant to Article 94(3) EPC issued Apr. 14, 2014 in corresponding European application No. 09 850 902.9 (5 pages).
Office Action issued Apr. 4, 2014 in corresponding Chinese appolication No. 200980162273.3 (5 pages).

* cited by examiner

US 9,070,726 B2

TEMPERATURE CONTROL METHOD OF CHEMICAL VAPOR DEPOSITION DEVICE

BACKGROUND OF THE INVENTION

1. Field of the Invention

The present invention relates to a temperature control method of a chemical vapor deposition device and, more particularly, to a temperature control method which is capable of precisely measuring a temperature distribution at the top surface of a susceptor and also precisely controlling a temperature at the top surface of the susceptor.

2. Discussion of the Related Art

A chemical vapor deposition device is used to deposit a thin film on a surface of a semiconductor wafer. A desired thin film is deposited on wafers placed in a susceptor by blowing a process gas into a chamber through gas suppliers.

In depositing the thin film, adequate internal temperature is very important because it has a great effect on the quality of the thin film. In particular, in metal organic chemical vapor deposition (MOCVD), a high efficiency light-emitting device can be obtained only when temperature control is effectively performed.

For effective temperature control, first, a temperature distribution at the top surface of a susceptor must be able to be precisely checked. This is because the amount of electric power to be supplied to heaters can be checked only when an accurate temperature distribution is checked.

There may be a specific temperature difference between a surface temperature in a plurality of wafers loaded into the top surface of the susceptor and a surface temperature of the susceptor. According to the prior art, temperature control is performed by not distinguishing a temperature in the susceptor surface and a temperature in the wafer surface from each other.

In order to produce a higher-efficiency and higher-quality thin film, it is necessary to precisely perform temperature control by accurately checking a difference in the surface temperature.

There is, however, a problem in that very complicated and expensive equipment must be additionally installed in order to check the difference in the temperature.

SUMMARY OF THE INVENTION

There is a need for a method of accurately checking a temperature distribution at the top of a susceptor in order to produce a high quality thin film.

More particularly, there is a need for a temperature control method, which is capable of distinguishing a temperature in a susceptor surface and a temperature in a wafer surface from each other and of taking the temperature difference into consideration.

Furthermore, there is a need for a method capable of checking a temperature difference between a susceptor surface and a wafer surface without additional complicated and expensive equipment.

The technical objects to be achieved by the present invention are not limited to the above-mentioned objects and other technical objects that have not been mentioned above will become evident to those skilled in the art from the following description.

To solve the problems, the present invention provides a temperature control method of a chemical vapor deposition device, including a chamber, a susceptor rotatably placed within the chamber and configured to have wafers loaded on its upper surface, a gas supplier provided within the chamber and configured to spray gas toward the wafers, heaters provided within the susceptor and configured to heat the wafers, and temperature sensors provided at the upper portion of the chamber and configured to measure a temperature at an upper surface of the susceptor, wherein the temperature control method includes the steps of (a) calculating a temperature distribution of the susceptor based on the measured values of the temperature sensors and classifying relatively high temperature sections of the temperature distribution as susceptor sections and relatively low temperature sections of the temperature distribution as wafer sections and (b) controlling the heaters by comparing a temperature at a position, selected from the susceptor sections or the wafer sections, with a preset reference temperature.

Furthermore, in the step (a), the temperature distribution corresponds to a time-based temperature distribution, and the step (a) may include classifying the relatively high temperature sections of the time-based temperature distribution as the susceptor sections and the relatively low temperature sections of the time-based temperature distribution as the wafer sections by using a preset filtering function.

Furthermore, the step (a) may include the steps of (a1) classifying the measured values of the temperature sensors into the relatively high temperature sections and the relatively low temperature sections by using a preset filtering function and (a2) matching a susceptor section in preset wafer arrangement angle information with the high temperature section and matching a wafer section in the preset wafer arrangement angle information with the low temperature section.

Furthermore, the step (a) may further include the step of allocating an identifier ID to each of the susceptor sections and the wafer sections so that a specific section can be selected from among the susceptor sections and the wafer sections.

Furthermore, the step (b) may include controlling the heaters based on a temperature of a section to which an identifier selected by a user has been allocated.

Furthermore, the temperature control method may further include the step of excluding temperature change sections, appearing when temperature is changed at edge portions of the wafers, from the susceptor sections or the wafer sections.

To solve the problems, the present invention provides a temperature control method of a chemical vapor deposition device, including a chamber, a susceptor rotatably placed within the chamber and configured to have wafers loaded on its upper surface, a gas supplier provided within the chamber and configured to spray gas toward the wafers, heaters provided within the susceptor and configured to heat the wafers, temperature sensors provided at the upper portion of the chamber and configured to measure a temperature at an upper surface of the susceptor, a motor configured to rotate the susceptor, and an encoder configured to measure the rotating speed of the motor, wherein the temperature control method includes the steps of (a) calculating a first temperature distribution of the susceptor by matching the measured values of the temperature sensors with the measured value of the encoder; (b) calculating a second temperature distribution of the susceptor by using the measured values of the temperature sensors and preset wafer arrangement angle information; (c) adjusting the measured value of the encoder if an error exists by comparing the first temperature distribution with the second temperature distribution; and (d) controlling the heaters based on a third temperature distribution calculated using the adjusted measured value of the encoder.

Furthermore, the step (a) may include calculating a susceptor rotation angle by using a motor rotation angle, calculated using the measured value of the encoder, and a preset rotation ratio of the motor to the susceptor and calculating the first temperature distribution by matching the calculated susceptor rotation angle with the measured values of the temperature sensors.

Furthermore, the step (a) may further include the step of classifying a relatively high temperature section of the first temperature distribution as a first susceptor section and a relatively low temperature section of the first temperature distribution as a first wafer section by using a preset filtering function.

Furthermore, the step (b) may further include the step of classifying a relatively high temperature section of the second temperature distribution as a second susceptor section and a relatively low temperature section of the second temperature distribution as a second wafer section by using the preset filtering function.

Furthermore, the step (b) may further include the steps of (b1) classifying the second temperature distribution into a relatively high temperature section and a relatively low temperature section by using the preset filtering function and (b2) matching a second susceptor section in the preset wafer arrangement angle information with the high temperature section and matching a second wafer section in the preset wafer arrangement angle information with the low temperature section.

Furthermore, the step (b2) may include performing the matching so that an average variation between an angle of the center of the second susceptor section or the second wafer section and an angle of the center of the high temperature section or the low temperature section is minimized.

Furthermore, the step (b2) may include performing the matching so that an average variation between an angle of the boundary of the second susceptor section or the second wafer section and an angle of the boundary of the high temperature section or the low temperature section is minimized.

Furthermore, the temperature control method may further include the step of excluding temperature change sections, appearing when temperature is changed at the edge portions of the wafers, from the first susceptor section, the first wafer section, the second susceptor section, and the second wafer section.

Furthermore, the step (c) may include adjusting the measured value of the encoder if an error is greater than a preset value by comparing the first susceptor section with the second susceptor section or the first wafer section with the second wafer section.

Furthermore, the step (c) may include comparing an angle of the center of the first susceptor section with an angle of the center of the second susceptor section and an angle of the center of the first wafer section with an angle of the center of the second wafer section.

Furthermore, the temperature control method may further include the step of determining whether a position of the second susceptor section or the second wafer section is approximately checked within a preset error range before the step (c), wherein if, as a result of the determination, the position of the second susceptor section or the second wafer section is approximately checked, the step (c) is performed.

Furthermore, the step (c) may include adding or subtracting a numerical value, corresponding to the error, to or from an initial value of the measured value of the encoder for every preset time or whenever the error reaches a preset limit, if the error exists.

Furthermore, the third temperature distribution of the step (d) may include a third susceptor section or a third wafer section calculated by using the adjusted measured value of the encoder, and the step (d) may include controlling the heaters by comparing an average temperature or a real-time temperature at a position, selected from the third susceptor section or the third wafer section, with a preset reference temperature.

Furthermore, the step (d) may further include the step of allocating an identifier ID to each of the third susceptor section and the third wafer section so that a specific section can be selected from the third susceptor section and the third wafer section in the third temperature distribution.

Furthermore, the step (d) may include controlling the heaters based on a temperature of a section to which an identifier selected by a user has been allocated.

To solve the problems, the present invention provides a temperature control method of a chemical vapor deposition device, including a chamber, a susceptor rotatably placed within the chamber and configured to have wafers loaded on its upper surface, a gas supplier provided within the chamber and configured to spray gas toward the wafers, heaters provided within the susceptor and configured to heat the wafers, temperature sensors provided at the upper portion of the chamber and configured to measure a temperature at the upper portion of the susceptor, a motor configured to rotate the susceptor, an encoder configured to measure the rotating speed of the motor, a rotation recognition mark provided to be integrally rotated along with the susceptor, and a rotation recognition sensor provided at the chamber in order to determine a rotation state of the susceptor and configured to detect the rotation recognition mark, wherein the temperature control method includes the steps of (a) calculating a first temperature distribution of the susceptor by matching the measured values of the temperature sensors with the measured value of the encoder; (b) calculating a second temperature distribution of the susceptor by using the rotation recognition sensor and the temperature sensors; (c) adjusting the measured value of the encoder if an error exists by comparing the first temperature distribution with the second temperature distribution; and (d) controlling the heaters based on a third temperature distribution calculated using the adjusted measured value of the encoder.

Furthermore, the step (b) may include the steps of (b1) calculating the rotation angle or rotation time of the susceptor by using the rotation recognition sensor and (b2) calculating the second temperature distribution by matching the calculated rotation angle or rotation time with the measured values of the temperature sensors.

There is an advantage in that a temperature distribution can be accurately checked by using values measured by the temperature sensors without an additional complicated apparatus.

Furthermore, there is an advantage in that reliability of values measured by the temperature sensors can be improved by using a value measured by the encoder which is chiefly embedded in the motor for rotating the susceptor.

Furthermore, there is an advantage in that a temperature distribution can be accurately checked because an actual degree of a susceptor section or a wafer section selected through an allocated identifier can be checked.

The technical effects of the present invention are not limited to the above-described effects and other technical effects that have not been described will be evidently understood by those skilled in the art from the following description.

DETAILED DESCRIPTION OF THE EMBODIMENTS

Figure 1:
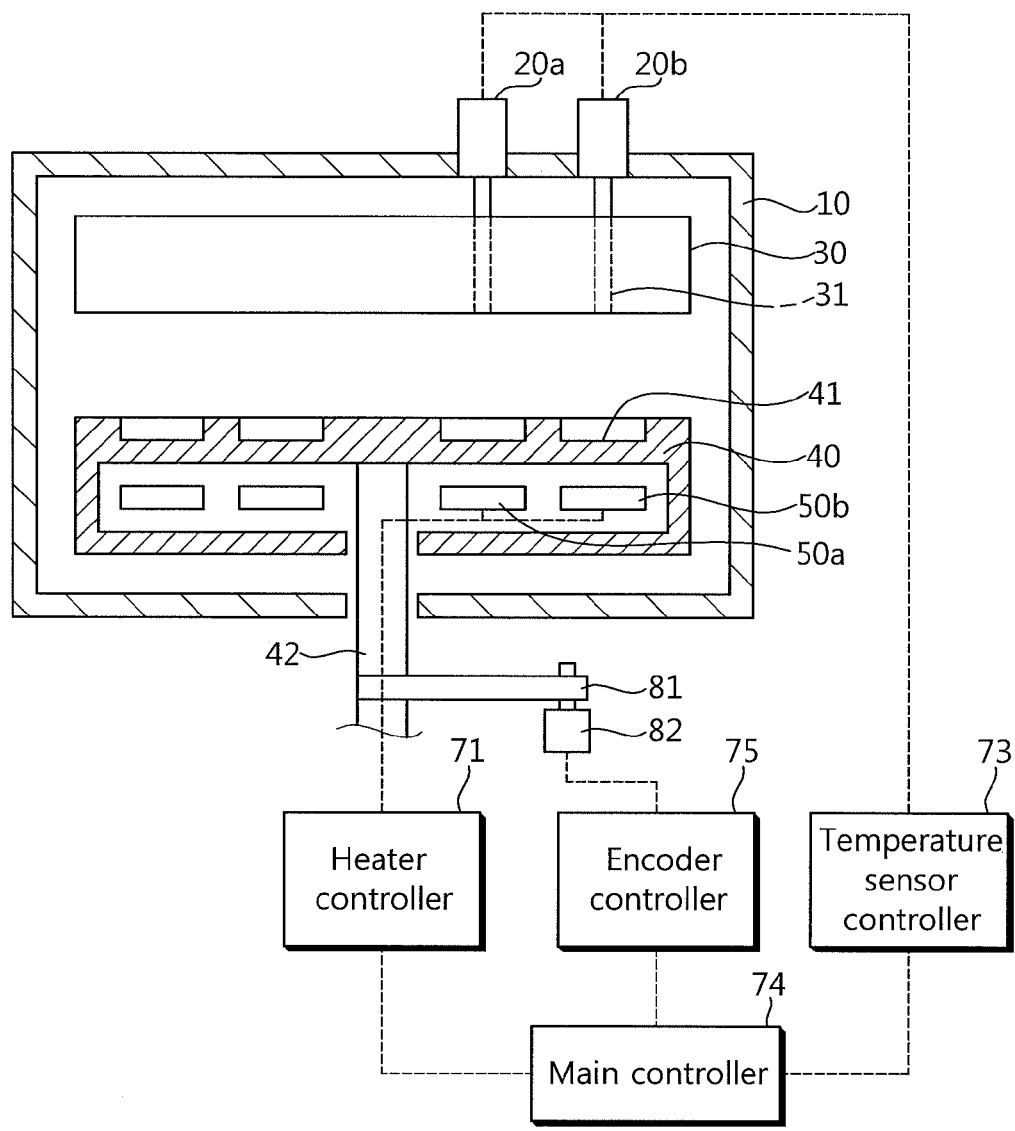
FIG. 1 is a schematic cross-sectional view showing a chemical vapor deposition device according to a first embodiment of the present invention.

Hereinafter, embodiments of the present invention will be described in detail with reference to the accompanying drawings. However, the present invention is not limited to the disclosed embodiments, but may be implemented in various forms. The present embodiments are provided to complete the disclosure of the present invention and to allow those having ordinary skill in the art to understand the scope of the present invention. The shapes, etc., of elements in the drawings may be exaggerated in order to highlight clearer descriptions thereof. The same reference numbers are used throughout the drawings to refer to the same parts FIG. 1 is a schematic cross-sectional view showing a chemical vapor deposition device according to a first embodiment of the present invention.

As shown in FIG. 1, the chemical vapor deposition device according to the present embodiment includes a chamber 10, a susceptor 40, a gas supplier 30, heaters 50a and 50b, temperature sensors 20a and 20b, a motor 82, a heater controller 71, a temperature sensor controller 73, a main controller 74, and an encoder controller 75.

If the present embodiment is applied to a metal organic chemical vapor deposition (MOCVD) device, group III gas and group V gas may be sprayed from the gas supplier 30 toward wafers loaded into respective wafer pockets 41 at the tops of the susceptor 40.

The temperature sensors 20a and 20b may be provided on the upper portion of the chamber 10 in order to detect a temperature at an upper surface of the susceptor 40. Alternatively, if temperature of the wafers loaded on the susceptor can be properly measured, the temperature sensors may be placed on the side of the susceptor or at the bottom of the susceptor.

A pyrometer using reflected light from an object may be used as the temperature sensors 20a and 20b in order to measure temperature in a contactless way. For example, a pyrometer for measuring a surface temperature in the frequency of 700 Hz may be used.

Since the gas supplier 30 is provided between the temperature sensors 20a and 20b and the susceptor 40, through holes 31 may be provided within the gas supplier so that reflected light at the top of the susceptor 40 can be secured.

A plurality of the temperature sensors 20a and 20b may be arranged in a radius direction to the rotating shaft 42 of the susceptor 40. Accordingly, a temperature distribution according to the distance from the rotating shaft 42 of the susceptor 40 can be checked.

The wafers are loaded into the respective wafer pockets 41 so that thin films can be formed on their top surfaces.

A plurality of the wafer pockets 41 may be provided on the top surface of the susceptor 40.

A plurality of the heaters 50a and 50b each a doughnut form may be provided within the susceptor 40 in order to heat the susceptor 40. The heater controller 71 may control the plurality of heaters 50a and 50b individually. That is, the heater controller 71 may uniformly control the temperatures of the plurality of heaters 50a and 50b, proportionally control the temperatures of the heaters 50a and 50b, and separately control a rise and fall of the temperatures of the heaters 50a and 50b.

The susceptor 40 is rotated around the rotating shaft 42 at high speed, but the heaters 50a and 50b may remain stopped.

The motor 82 for rotating the susceptor 40 is provided. Rotary power of the motor is transferred to the rotating shaft 42 of the susceptor 40 through a belt 81. The motor 82 is provided with an encoder (not shown) for measuring the rotating speed.

If the rotary power is indirectly transferred through the belt 81, there may be a slight difference between the rotation ratio and a design value. According to this difference, there may be a difference between a rotation angle of the susceptor, determined based on an encoder signal, and an actual rotation angle of the susceptor.

Figure 2:
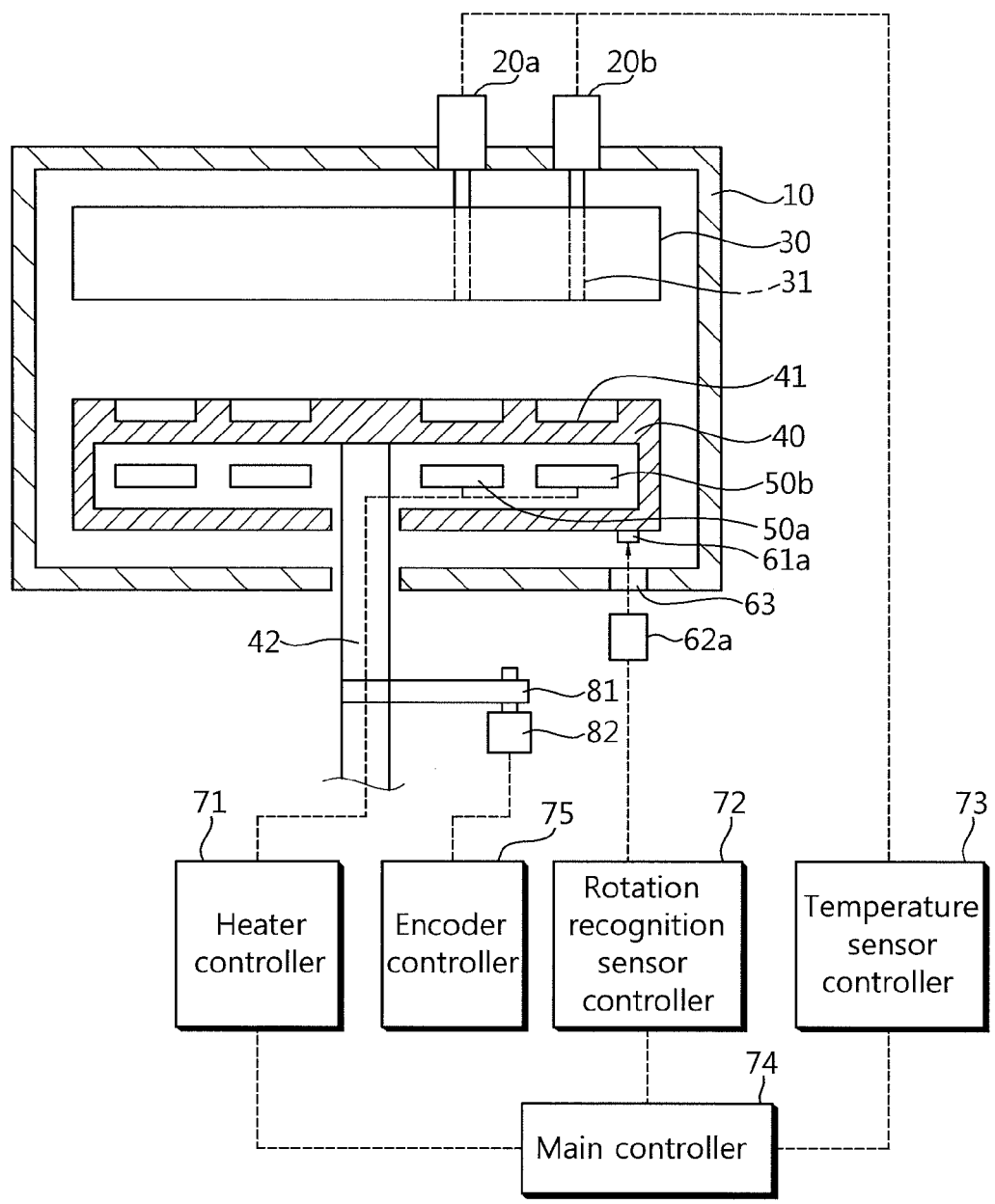
FIG. 2 is a schematic cross-sectional view showing a chemical vapor deposition device according to a second embodiment of the present invention.

FIG. 2 is a schematic cross-sectional view showing a chemical vapor deposition device according to a second embodiment of the present invention. The same reference numerals as those of FIG. 1 are used to refer to similar elements FIG. 1, and a description of redundant parts is omitted for convenience of description.

A rotation recognition mark 61a may be placed on the bottom of the susceptor 40, and a rotation recognition sensor 62a for detecting the rotation recognition mark 61a may be provided outside the chamber 10. The rotation recognition mark 61a is not limited to the above position, but may be placed in other parts to be integrally rotated along with the susceptor 40. The rotation recognition mark 61a may include a concave part or a convex part, and the rotation recognition mark 61a may be formed of a reflection unit. Furthermore, the rotation recognition mark 61a is not limited to a specific form, and the rotation recognition mark 61a may have various forms or materials that can be detected by the rotation recognition sensor 62a according to the sensing method of the rotation recognition sensor 62a.

A method of detecting the rotation recognition mark may be various. For example, a method of checking whether light emitted from the rotation recognition sensor 62a has reached the rotation recognition mark 61a by checking that the light reaches the rotation recognition mark 61a through a transparent window 63 and light reflected from the rotation recognition mark 61a reaches the rotation recognition sensor 62a through the transparent window 63 may be used. That is, the above method is a method of detecting a change in a surface shape at the bottom of the susceptor 40.

Figure 3:
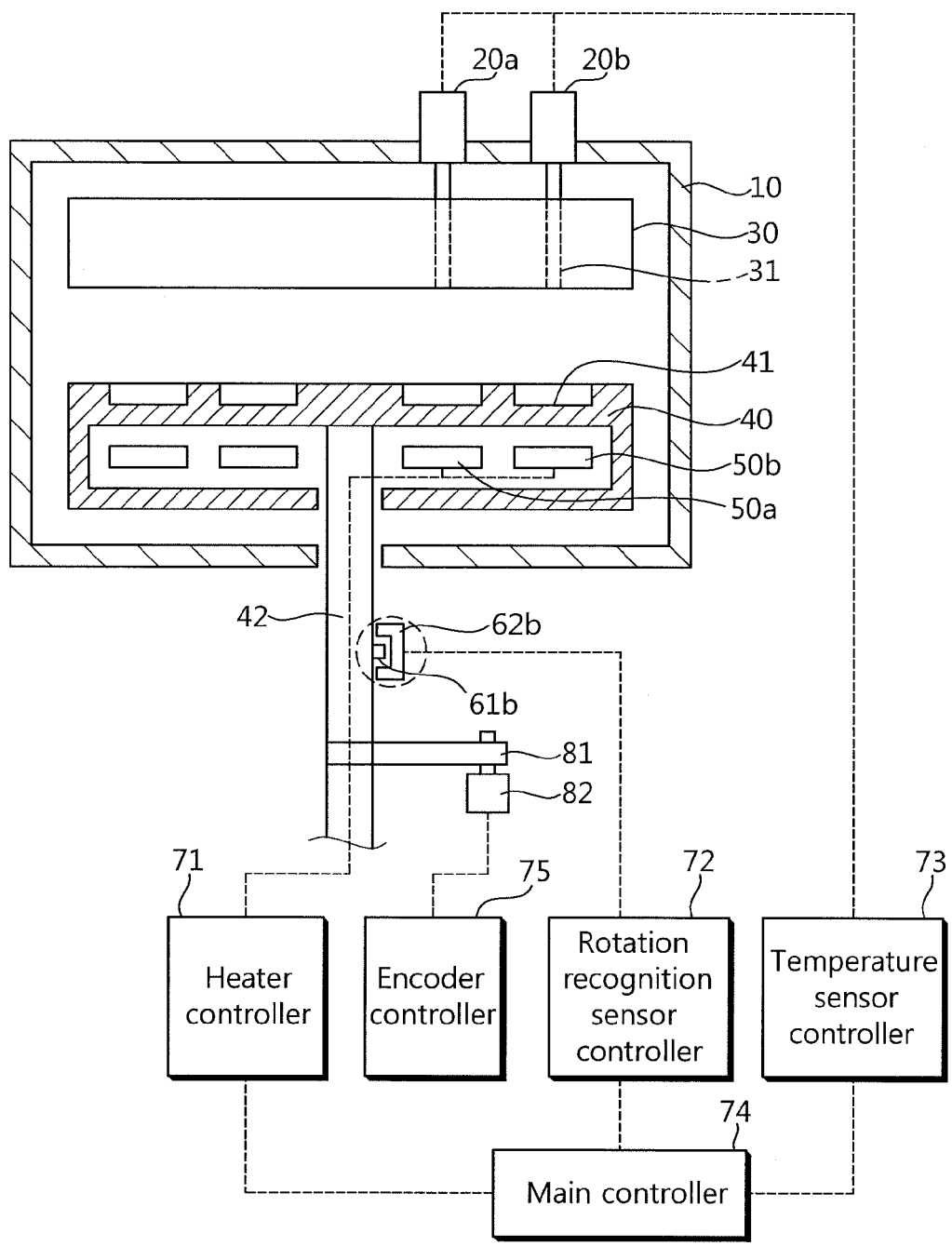
FIG. 3 is a schematic cross-sectional view showing a chemical vapor deposition device according to a third embodiment of the present invention.

FIG. 3 is a schematic cross-sectional view showing a chemical vapor deposition device according to a third embodiment of the present invention.

Figure 4:
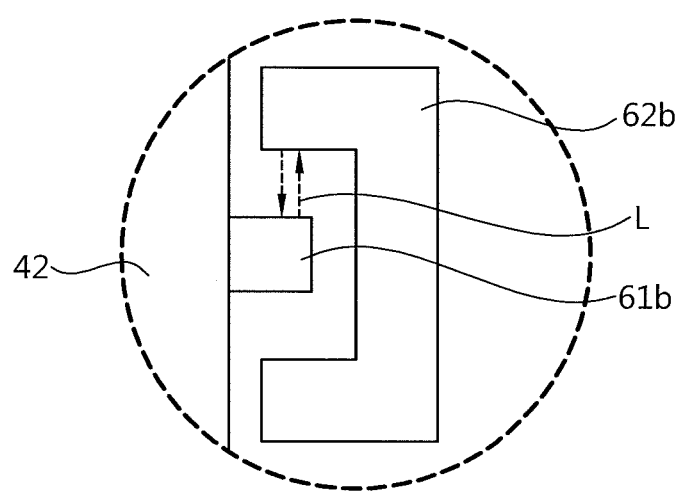
FIG. 4 is an enlarged view of a rotation recognition mark and a rotation recognition sensor part.

FIG. 4 is an enlarged view of a rotation recognition mark and a rotation recognition sensor part. The same reference numerals as those of the second embodiment are used to refer to similar elements of the second embodiment, for convenience of description.

As shown in FIG. 3, a rotation recognition sensor 62b may be placed near the rotating shaft 42 of the susceptor 40. A ray of light L is emitted on one side of the rotation recognition sensor 62b, and the ray of light L is detected on the other side of the rotation recognition sensor 62b. A rotation recognition mark 61b may be placed in the rotating shaft 42 of the susceptor 40. A moment when the rotation recognition mark 61b covers the ray of light L while passing through the rotation recognition sensor 62b can be detected by the rotation recognition sensor 62b.

Figure 5:
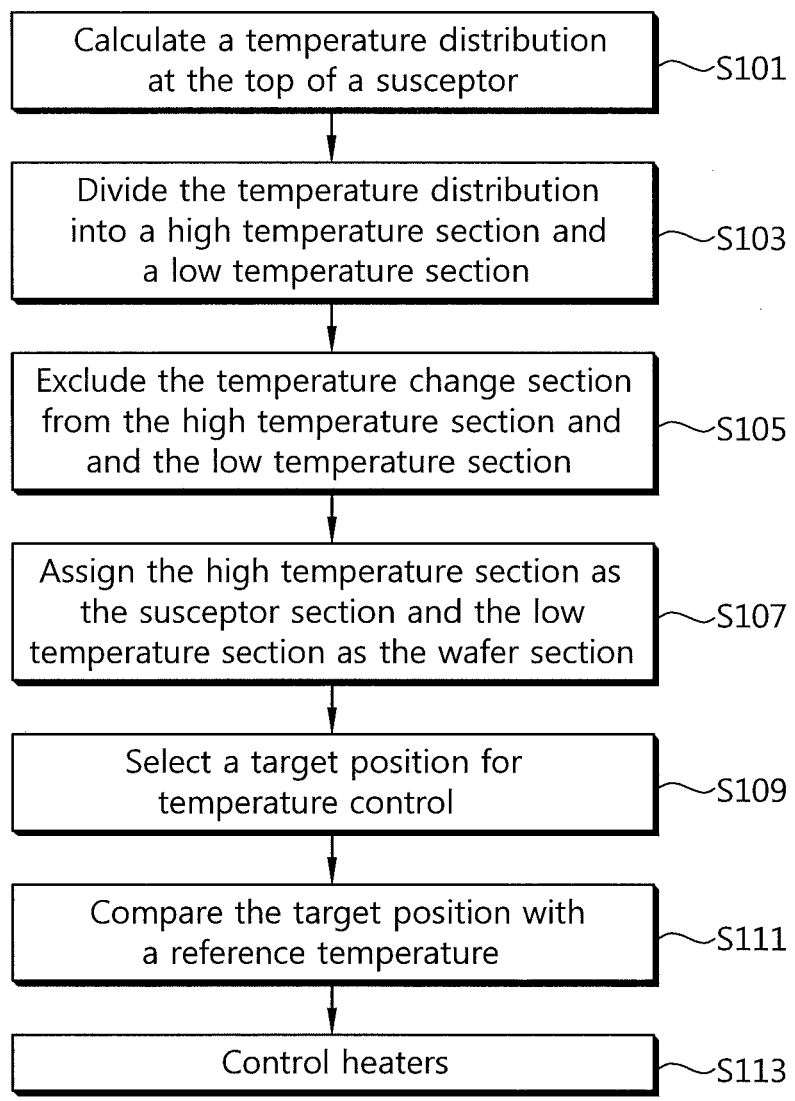
FIG. 5 is a schematic flowchart illustrating a first embodiment of a temperature control method of the chemical vapor deposition device according to the present invention.

FIG. 5 is a schematic flowchart illustrating a first embodiment of a temperature control method of the chemical vapor deposition device according to the present invention.

Figure 6:
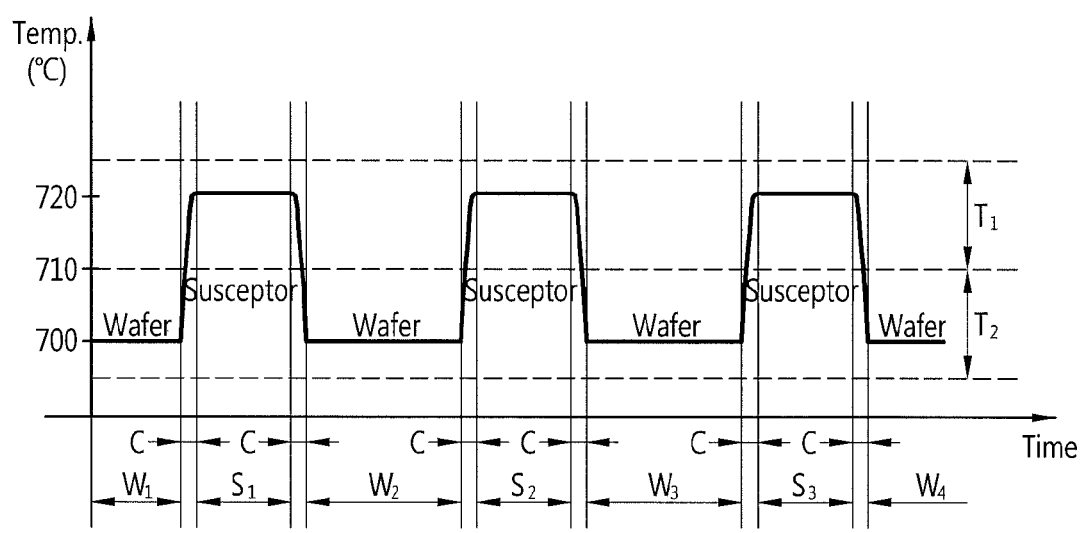
FIG. 6 is a graph illustrating an example of measured values of temperature sensors according to a lapse of time.

FIG. 6 is a graph illustrating an example of measured values of temperature sensors according to a lapse of time.

As can be seen from FIG. 5, first, a step S101 of calculating a temperature distribution at the top of the susceptor by using values measured by the temperature sensors may be performed, and an example of which is shown in FIG. 6.

As can be seen from FIG. 6, in general, temperatures in wafer sections W1, W2, W3, and W4 are lower than temperatures in susceptor sections S1, S2, and S3. A temperature change section C in which temperature is not constant, but is changed may appear at the edge of the wafer.

As can be seen from FIG. 5, next, a step S103 of dividing the temperature distribution into high temperature sections and low temperature sections may be performed. In FIG. 6, a section having a relatively high temperature of 710° C. or higher is indicated by T1, and a section having a relatively low temperature of 710° C. or lower is indicated by T2.

As can be seen from FIG. 5, next, a step S105 of excluding the temperature change sections from the high temperature sections and the low temperature sections may be performed. Next, a step S107 of assigning the high temperature sections as the susceptor sections and the low temperature sections as the wafer sections may be performed. As can be seen from FIG. 6, the sections W1, W2, W3, and W4 from which the temperature change sections C have been excluded may be classified as the wafer sections, and the sections S1, S2, and S3 from which the temperature change sections C have been excluded may be classified as the susceptor sections.

As can be seen from FIG. 5, next, a step S109 of selecting a target position for temperature control may be performed. Furthermore, a temperature at the target position may be compared with a reference temperature (S111), and the heaters may be controlled based on the result of the comparison (S113). As can be seen from FIG. 6, for example, a target position for temperature control may be selected from among the sections W1, W2, W3, W4, S1, S2, and S3, and the heaters may be controlled by comparing a preset reference temperature and temperature at the target position.

Figure 7:
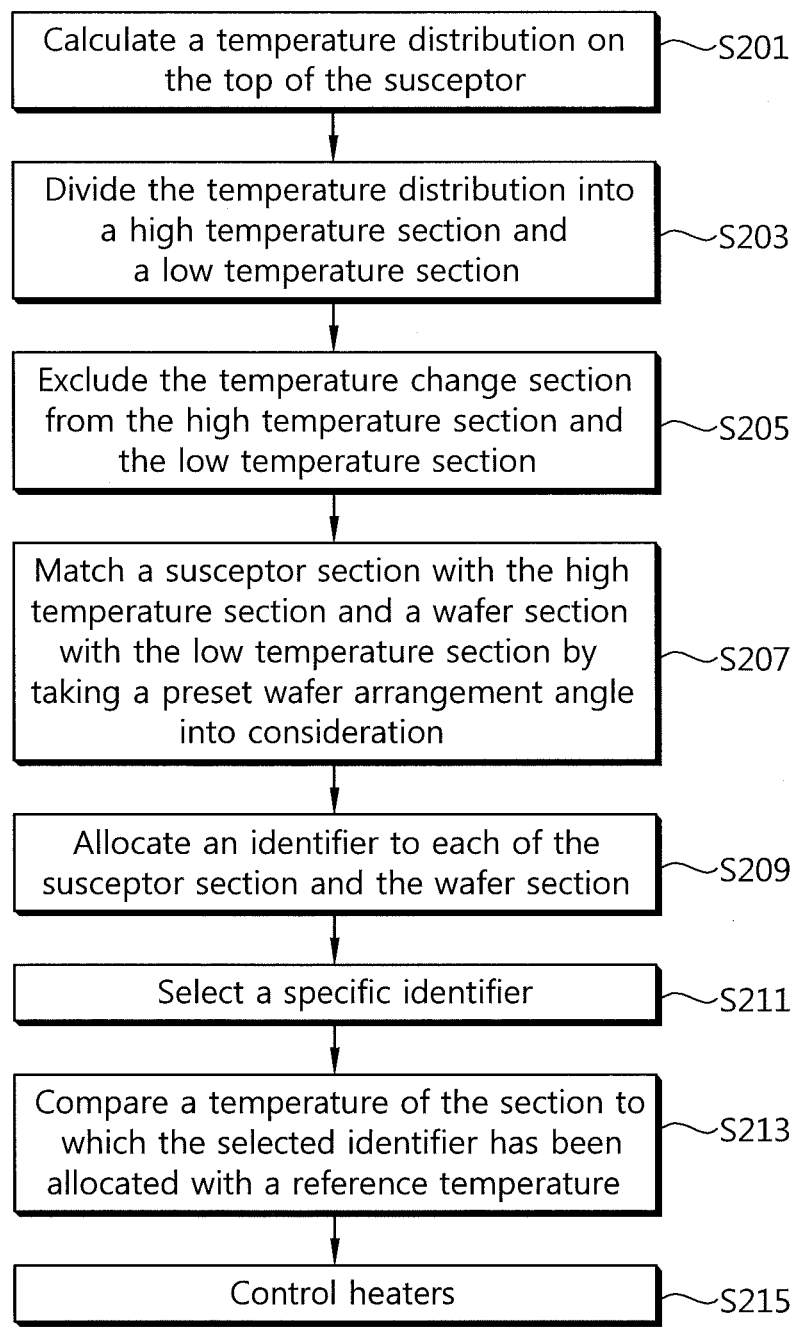
FIG. 7 is a detailed flowchart illustrating the first embodiment of the temperature control method of the chemical vapor deposition device according to the present invention.

FIG. 7 is a detailed flowchart illustrating the first embodiment of the temperature control method of the chemical vapor deposition device according to the present invention.

Figure 8:
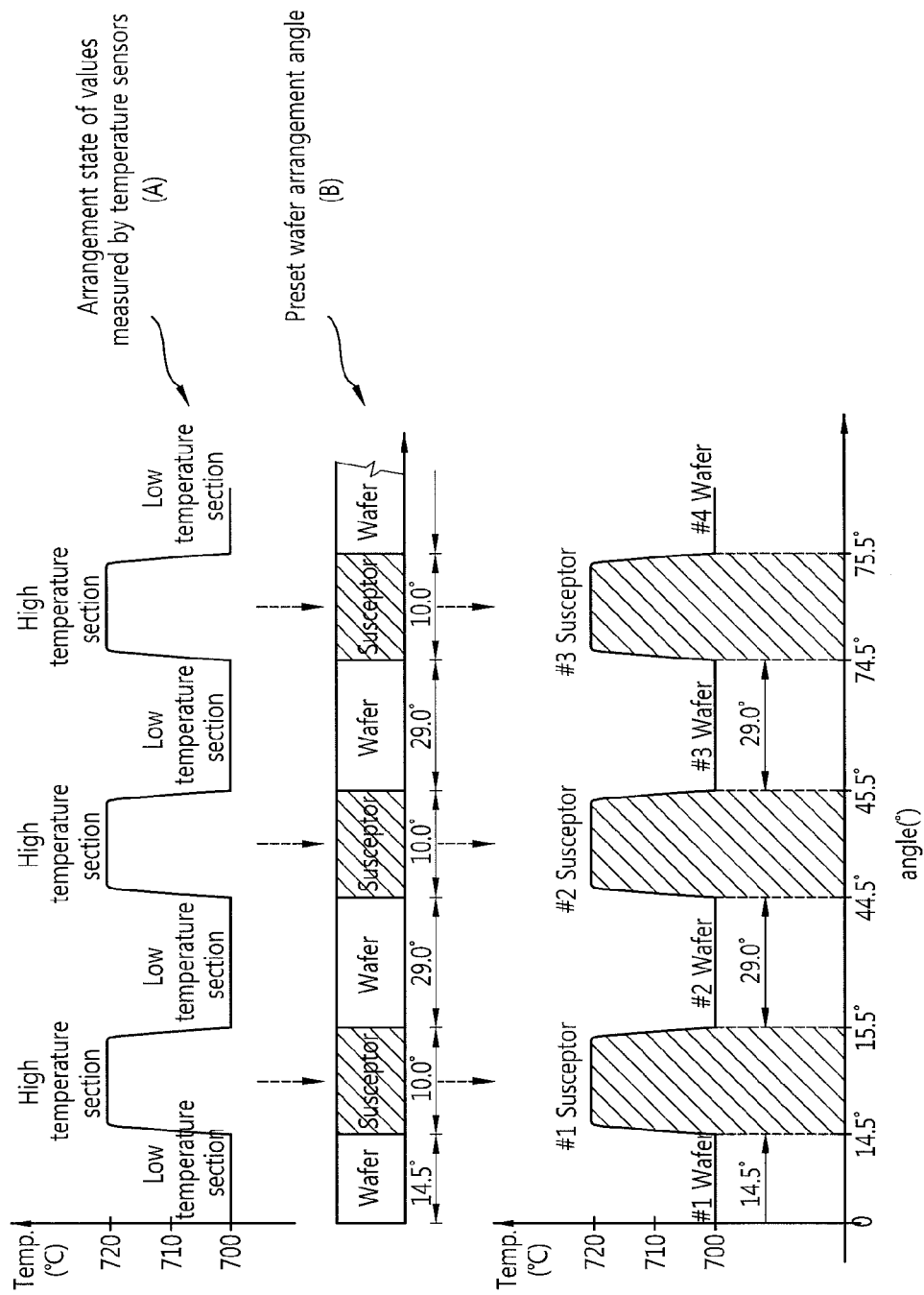
FIG. 8 is a graph illustrating a process in which a high temperature section and a low temperature section are matched with a susceptor section or a wafer section based on preset wafer arrangement angle information.

FIG. 8 is a graph illustrating a process in which a high temperature section and a low temperature section are matched with a susceptor section or a wafer section based on preset wafer arrangement angle information.

As can be seen from FIG. 7, first, a step S201 of calculating a temperature distribution at the top of the susceptor may be performed (refer to FIG. 6). Next, a step S203 of dividing the temperature distribution into high temperature sections and low temperature sections using a filtering function may be performed. The filtering function may be designed to classify a section, having temperature higher than an average temperature of all the sections of the temperature distribution, as the high temperature section and a section having temperature lower than the average temperature of all the sections of the temperature distribution, as the low temperature section. Alternatively, the filtering function may be designed to classify a high temperature part of a specific temperature as the high temperature section and a low temperature part of the specific temperature as the low temperature section, if the specific temperature is repeatedly measured within a preset error range.

Next, temperature change sections may be excluded from the high temperature sections and the low temperature sections (S205). A step S207 of matching a susceptor section with the high temperature section and a wafer section with the low temperature section by taking a preset wafer arrangement angle into consideration may be performed. Here, the step S207 may be first performed, and the step S205 may be then performed.

The step S205 may be performed in such a manner that a section in which the amount of an average temperature change during a preset time is greater than the amount of a preset temperature change is excluded from the high temperature sections and the low temperature sections.

As can be seen from FIG. 8, there is shown a process of matching the susceptor sections and the wafer sections with the preset wafer arrangement angle. The matching method may be various, and an example of which is shown in FIG. 8.

First, data included in the high temperature section and the low temperature section is prepared from values measured by the temperature sensors. Next, the arrangement angles of the wafer section and the susceptor section are brought close to the arrangement angles of the high temperature section and the low temperature section by rotating (moving an angle reference point in software) the preset wafer arrangement angle clockwise or counterclockwise at a specific angle on the basis of the rotating shaft of the susceptor.

One of methods of bringing the arrangement angles of the wafer section and the susceptor section close to the arrangement angles of the high temperature section and the low temperature section is to minimize an average variation between an angle of a boundary of a second susceptor section or a second wafer section and an angle of a boundary of the high temperature section or the low temperature section. Alternatively, an average variation between an angle of the center of the second susceptor section or the second wafer section and an angle of the center of the high temperature section or the low temperature section may be minimized.

As can be seen from FIG. 7, next, an identifier is allocated to each of the susceptor sections and the wafer sections (S209), and a user selects a specific identifier ID (S211). A step S213 of comparing a temperature of the section to which the selected identifier has been allocated with a reference temperature may be performed. Accordingly, an actual temperature of the susceptor section (or the wafer section) can be checked through the allocated identifier.

If, as a result of the comparison, the temperature of the section does not reach the reference temperature, the heaters may be controlled so that more electric power is supplied to the heaters. If, as a result of the comparison, the temperature of the section exceeds the reference temperature, the heaters may be controlled so that electric power supplied to the heaters is reduced (S215).

Figure 9:
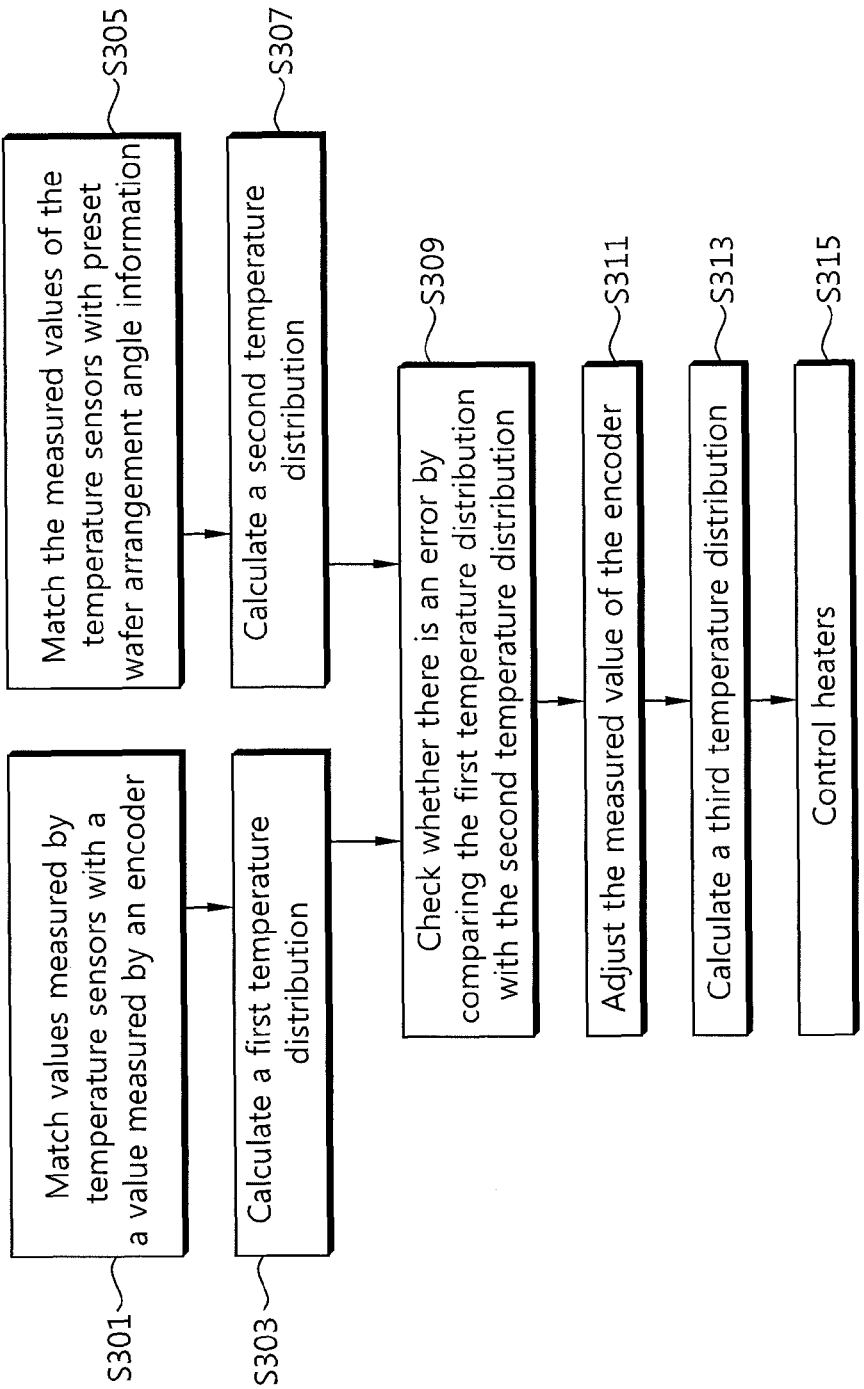
FIG. 9 is a flowchart illustrating a second embodiment of a temperature control method of the chemical vapor deposition device according to the present invention.

FIG. 9 is a flowchart illustrating a second embodiment of a temperature control method of the chemical vapor deposition device according to the present invention.

The second embodiment corresponds to the case in which a step using a value measured by the encoder is further added in the first embodiment.

As can be seen from FIG. 9, first, values measured by the temperature sensors are matched with a value measured by the encoder (S301), and thus a first temperature distribution is calculated (S303).

Meanwhile, a second temperature distribution is calculated (S307) by matching the measured values of the temperature sensors with preset wafer arrangement angle information (S305).

A step S309 of checking whether there is an error by comparing the first temperature distribution with the second temperature distribution may be performed.

If, as a result of the check, there is an error, a step S311 of adjusting the measured value of the encoder in order to remove the error may be performed.

Accordingly, a third temperature distribution in which the measured values of the temperature sensors have been matched with the adjusted measured value of the encoder is calculated (S313). The heaters are controlled based on the third temperature distribution (S315).

Figure 10:
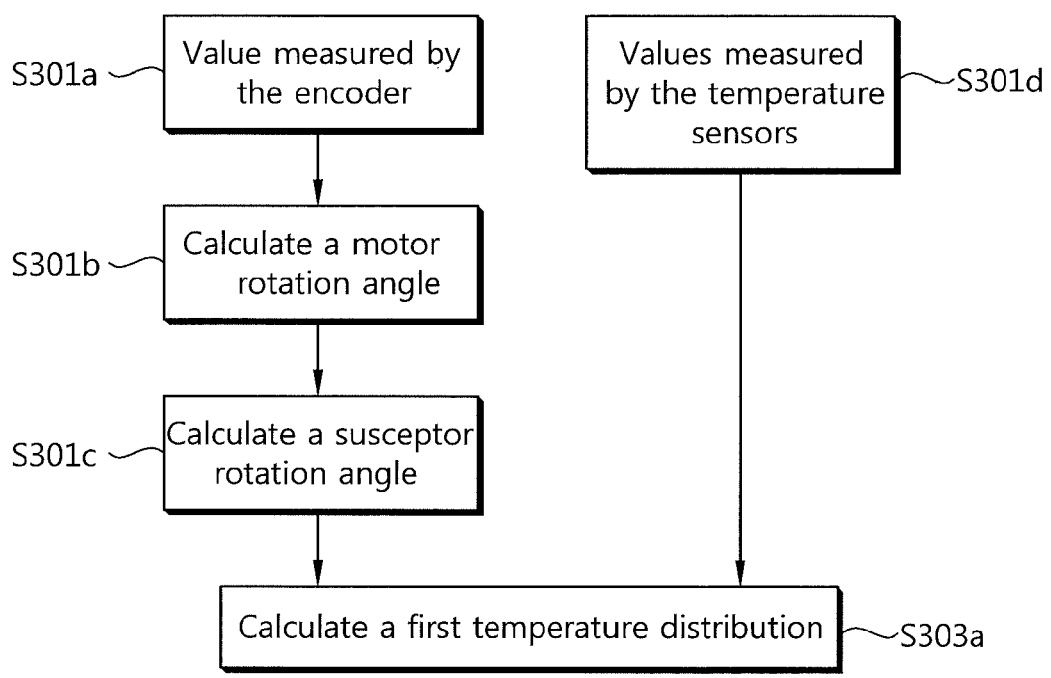
FIG. 10 is a detailed flowchart illustrating an example of a method of calculating a first temperature distribution in FIG. 9.

FIG. 10 is a detailed flowchart illustrating an example of a method of calculating a first temperature distribution in FIG. 9.

As can be seen from FIG. 10, a motor rotation angle per time may be calculated (S301b) from a value measured by the encoder (the rotating speed of the motor) (S301a). A susceptor rotation angle may be calculated (S301c) by using a preset rotation ratio of the motor to the susceptor from the calculated motor rotation angle. A first temperature distribution for each angle may be calculated (S303a) by matching the calculated susceptor rotation angle with values measured by the temperature sensors (S301d).

Figure 11:
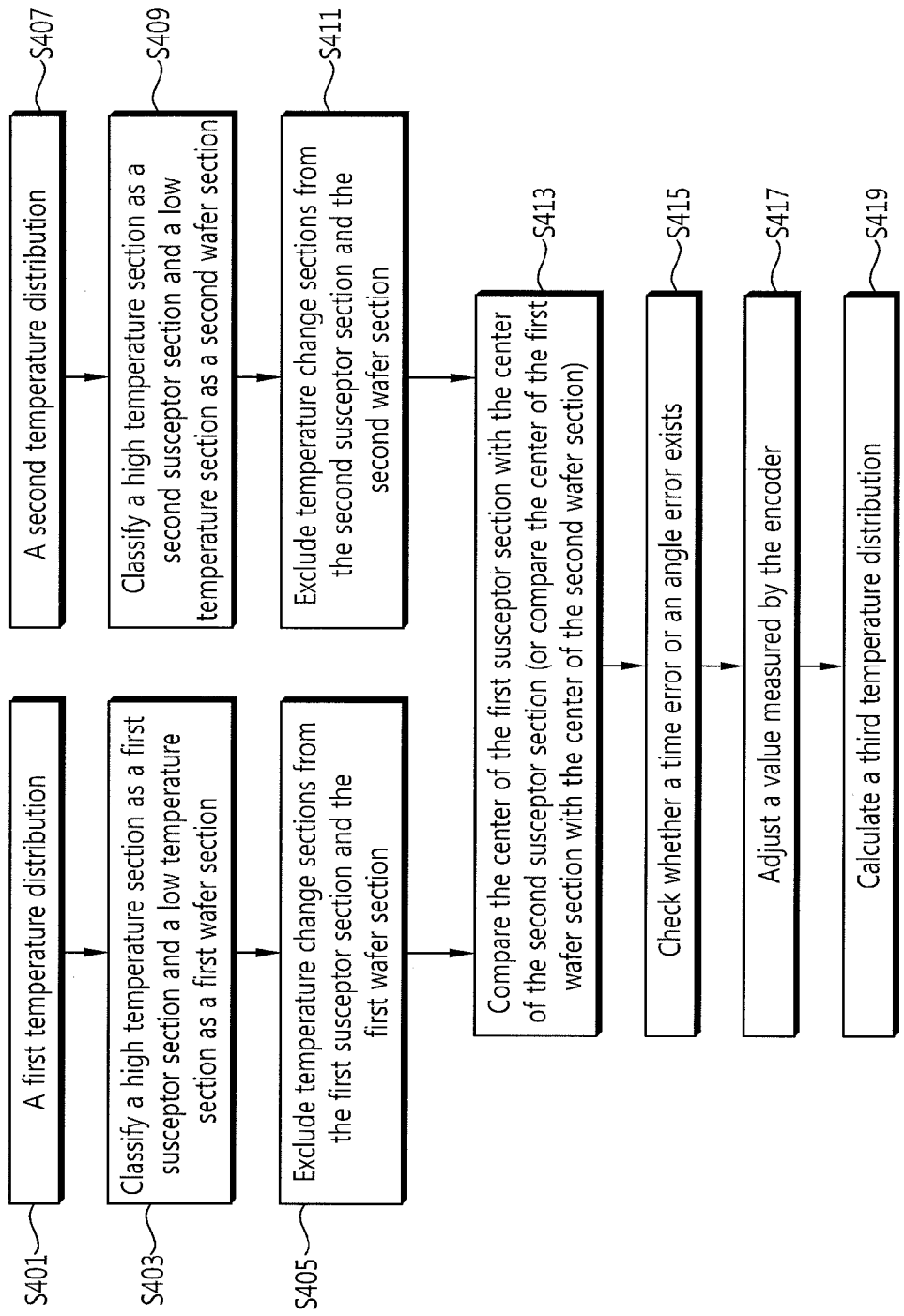
FIG. 11 is a detailed flowchart illustrating a process of calculating a third temperature distribution in the second embodiment of the temperature control method of the chemical vapor deposition device according to the present invention.

FIG. 11 is a detailed flowchart illustrating a process of calculating a third temperature distribution in the second embodiment of the temperature control method of the chemical vapor deposition device according to the present invention.

As can be seen from FIG. 11, a first temperature distribution is calculated using a preset filtering function (S401). A high temperature section is classified as a first susceptor section and a low temperature section is classified as a first wafer section in the calculated first temperature distribution (S403). A step S405 of excluding temperature change sections from the first susceptor section and the first wafer section is performed. A method of excluding the temperature change sections is similar to that of the first embodiment.

Meanwhile, a second temperature distribution is calculated (S407). A high temperature section is classified as a second susceptor section and a low temperature section is classified as a second wafer section in the calculated second temperature distribution (S409). Temperature change sections are excluded from the second susceptor section and the second wafer section (S411).

Next, the second susceptor section may be matched with the high temperature section and the second wafer section may be matched with the low temperature section according to an angle on the basis of a preset wafer arrangement angle. A detailed matching method is similar to that of the step S207.

Next, a step of allocating an identifier ID to each of the second susceptor section and the second wafer section may be further performed.

Next, a step of checking whether a time (or angle) error exists (S415) by comparing the center of the first susceptor section with the center of the second susceptor section or comparing the center of the first wafer section with the center of the second wafer section (S413) may be performed.

If, as a result of the check, the time (or angle) error exists, a value measured by the encoder may be adjusted (S417), and a step S419 of calculating a third temperature distribution may be performed.

Figure 12:
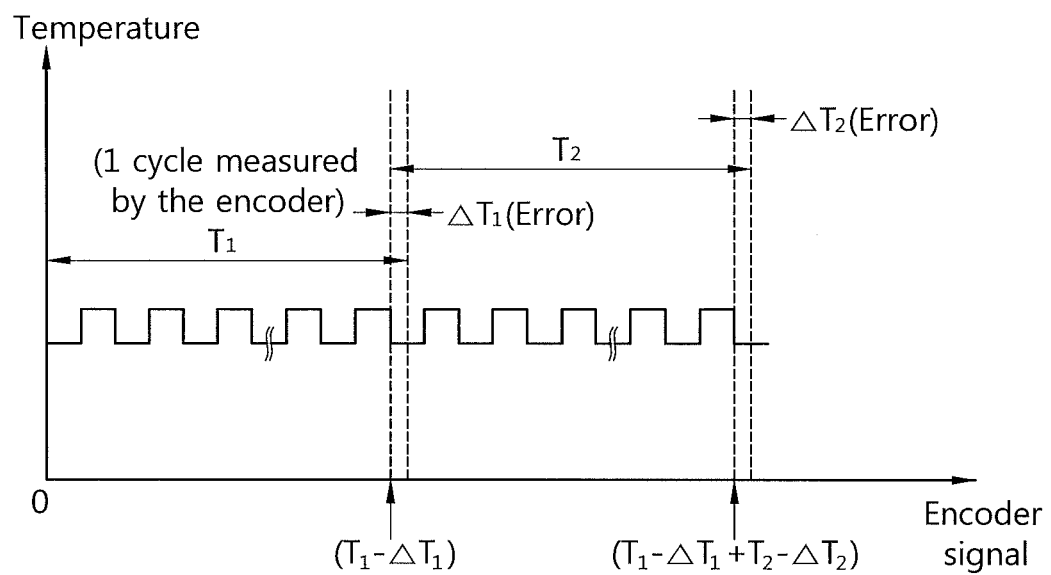
FIG. 12 is a graph of an encoder signal showing the step of adjusting the encoder signal in the second embodiment of the temperature control method of the chemical vapor deposition device according to the present invention.

FIG. 12 is a graph of an encoder signal showing the step of adjusting the encoder signal in the second embodiment of the temperature control method of the chemical vapor deposition device according to the present invention.

Before a step of adjusting an encoder signal is performed, a step of determining whether the position of the second susceptor section or the second wafer section is approximately checked within a preset error range may be performed. If, as a result of the determination, the position of the second susceptor section or the second wafer section is approximately checked, the step of adjusting the encoder signal may be performed.

Whether the rotating speed of the susceptor is constant may be checked by using a value measured by the encoder.

As can be seen from FIG. 12, if a first cycle $T_1$ measured by the encoder becomes long by $\Delta T_1$, the initial value of a second cycle $T_2$ is adjusted so that the second cycle $T_2$ is started at a point $(T_1 - \Delta T_1)$. Likewise, if the second cycle $T_2$ measured by the encoder becomes long by $\Delta T_2$, the initial value of the third cycle $T_3$ is adjusted so that the third cycle $T_3$ is started at a point $(T_1 - \Delta T_1 + T_2 - \Delta T_2)$.

The step S417 of FIG. 11 may be performed by adding or subtracting an error to or from the initial value of the value measured by the encoder every preset time or every time when the error reaches a preset limit, if there is the error by comparing the first temperature distribution with the second temperature distribution.

As can be seen from FIG. 11, the third temperature distribution at step S419 includes a third susceptor section or a third wafer section calculated by using the adjusted measured value of the encoder. The step S315 of FIG. 9 may be performed in such as way as to control the heaters by comparing an average temperature or a real-time temperature at a position, selected from the third susceptor section and the third wafer section, with a preset reference temperature.

Furthermore, the step S315 of FIG. 9 may be performed in such a way as to control the heaters on the basis of a temperature of a section to which an identifier selected by a user has been allocated.

Figure 13:
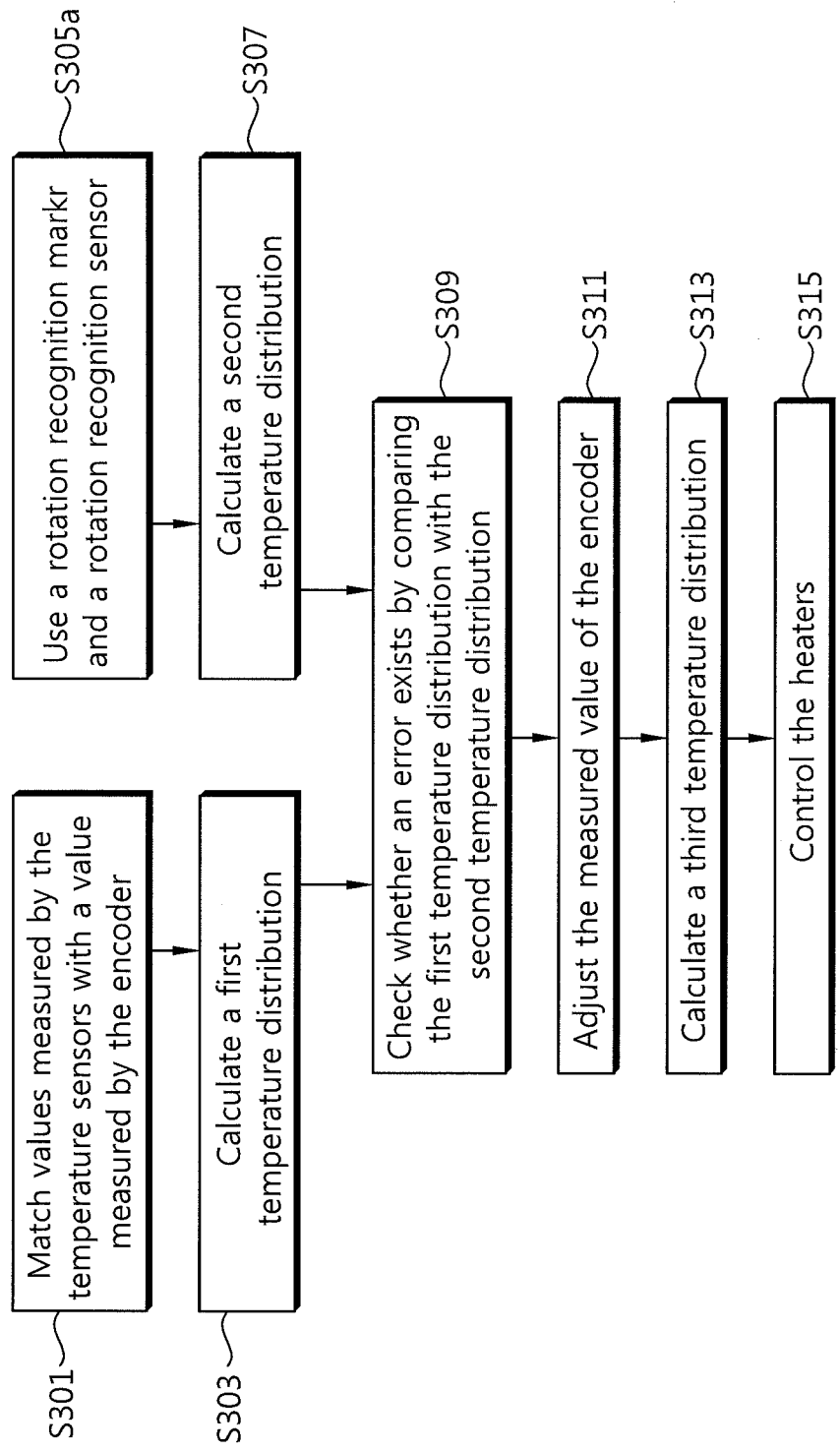
FIG. 13 is a flowchart illustrating the temperature control method of the chemical vapor deposition device shown in FIG. 2 or FIG. 3.

FIG. 13 is a flowchart illustrating the temperature control method of the chemical vapor deposition device shown in FIG. 2 or FIG. 3. The same reference numerals are used to refer to similar steps, for convenience of description.

As can be seen from FIG. 13, the second temperature distribution may be calculated (S307) by using the rotation recognition mark and the rotation recognition sensor (S305a).

If the rotation recognition mark and the rotation recognition sensor are used, an actual susceptor rotation state can be checked more reliably. Accordingly, an error between an actual susceptor rotation state and a susceptor rotation state checked using the encoder can also be accurately checked. Accordingly, the value of the encoder can also be accurately corrected.

An embodiment of the present invention described above and shown in the drawings should not be interpreted as limiting the technical spirit of the present invention. The scope of the present invention is restricted by only the writing of the claims, and a person having ordinary skill in the art to which the present invention pertains may modify and change the technical spirit of the present invention in various forms. Accordingly, the modification and change may fall within the scope of the present invention as long as they are evident to those skilled in the art.

What is claimed is:

1. A temperature control method of a chemical vapor deposition device, comprising a chamber, a susceptor rotatably placed within the chamber and configured to have wafers loaded on its upper surface, a gas supplier provided within the chamber and configured to spray gas toward the wafers, heaters provided within the susceptor and configured to heat the wafers, temperature sensors provided at an upper portion of the chamber and configured to measure a temperature at an upper surface of the susceptor, a motor configured to rotate the susceptor, and an encoder configured to measure a rotating speed of the motor, the temperature control method comprising the steps of:
    (a) calculating a first temperature distribution of the susceptor by matching the measured values of the temperature sensors with the measured value of the encoder;
    (b) calculating a second temperature distribution of the susceptor by using the measured values of the temperature sensors and preset wafer arrangement angle information;
    (c) adjusting the measured value of the encoder if an error exists by comparing the first temperature distribution with the second temperature distribution; and
    (d) controlling the heaters based on a third temperature distribution calculated using the adjusted measured value of the encoder.

2. The temperature control method as claimed in claim 1, wherein the step (a) includes calculating a susceptor rotation angle by using a motor rotation angle, calculated using the measured value of the encoder, and a preset rotation ratio of the motor to the susceptor and calculating the first temperature distribution by matching the calculated susceptor rotation angle with the measured values of the temperature sensors.

3. The temperature control method as claimed in claim 1, wherein the step (a) further comprises the step of classifying a high temperature section of the first temperature distribution as a first susceptor section and a low temperature section of the first temperature distribution as a first wafer section by using a preset filtering function.

4. The temperature control method as claimed in claim 3, wherein the step (b) further comprises the step of classifying a high temperature section of the second temperature distribution as a second susceptor section and a low temperature section of the second temperature distribution as a second wafer section by using the preset filtering function.

5. The temperature control method as claimed in claim 3, wherein the step (b) further comprises the steps of:
    (b1) classifying the second temperature distribution into a high temperature section and a low temperature section by using the preset filtering function, and
    (b2) matching a second susceptor section in the preset wafer arrangement angle information with the high temperature section and matching a second wafer section in the preset wafer arrangement angle information with the low temperature section.

6. The temperature control method as claimed in claim 5, wherein the step (b2) includes performing the matching so that an average variation between an angle of a center of the second susceptor section or the second wafer section and an angle of a center of the high temperature section or the low temperature section is minimized.

7. The temperature control method as claimed in claim 5, wherein the step (b2) includes performing the matching so that an average variation between an angle of a boundary of the second susceptor section or the second wafer section and an angle of a boundary of the high temperature section or the low temperature section is minimized.

8. The temperature control method as claimed in claim 4, further comprising the step of excluding temperature change sections, appearing when temperature is changed at edge portions of the wafers, from the first susceptor section, the first wafer section, the second susceptor section, and the second wafer section.

9. The temperature control method as claimed in claim 4, wherein the step (c) includes adjusting the measured value of the encoder if an error is greater than a preset value by comparing the first susceptor section with the second susceptor section or the first wafer section with the second wafer section.

10. The temperature control method as claimed in claim 9, wherein the step (c) includes comparing an angle of a center of the first susceptor section with an angle of a center of the second susceptor section and an angle of a center of the first wafer section with an angle of a center of the second wafer section.

11. The temperature control method as claimed in claim 9, further comprising the step of determining whether a position of the second susceptor section or the second wafer section is approximately checked within a preset error range before the step (c), wherein if, as a result of the determination, the position of the second susceptor section or the second wafer section is approximately checked, the step (c) is performed.

12. The temperature control method as claimed in claim 9, wherein the step (c) includes adding or subtracting a numerical value, corresponding to the error, to or from an initial value of the measured value of the encoder for every preset time or whenever the error reaches a preset limit, if the error exists.

13. The temperature control method as claimed in claim 9, wherein:
    the third temperature distribution of the step (d) comprises a third susceptor section or a third wafer section calculated by using the adjusted measured value of the encoder, and
    the step (d) includes controlling the heaters by comparing an average temperature or a real-time temperature at a position, selected from the third susceptor section or the third wafer section, with a preset reference temperature.

14. The temperature control method as claimed in claim 13, wherein the step (d) further comprises the step of allocating an identifier ID to each of the third susceptor section and the third wafer section so that a specific section can be selected from the third susceptor section and the third wafer section in the third temperature distribution.

15. The temperature control method as claimed in claim 14, wherein the step (d) includes controlling the heaters based on a temperature of a section to which an identifier selected by a user has been allocated.

16. A temperature control method of a chemical vapor deposition device, comprising a chamber, a susceptor rotatably placed within the chamber and configured to have wafers loaded on its upper surface, a gas supplier provided within the chamber and configured to spray gas toward the wafers, heaters provided within the susceptor and configured to heat the wafers, temperature sensors provided at an upper portion of the chamber and configured to measure a temperature at an upper surface of the susceptor, a motor configured to rotate the susceptor, an encoder configured to measure a rotating speed of the motor, a rotation recognition mark provided at a position where is integrally rotated along with the susceptor, and a rotation recognition sensor provided in the chamber in order to determine a rotation state of the susceptor and configured to detect the rotation recognition mark, the temperature control method comprising the steps of:

(a) calculating a first temperature distribution of the susceptor by matching the measured values of the temperature sensors with the measured value of the encoder;
(b) calculating a second temperature distribution of the susceptor by using the rotation recognition sensor and the temperature sensors;
(c) adjusting the measured value of the encoder if an error exists by comparing the first temperature distribution with the second temperature distribution; and
(d) controlling the heaters based on a third temperature distribution calculated using the adjusted measured value of the encoder.

17. The temperature control method as claimed in claim 16, wherein the step (b) comprises the steps of:
(b1) calculating a rotation angle or rotation time of the susceptor by using the rotation recognition sensor; and
(b2) calculating the second temperature distribution by matching the calculated rotation angle or rotation time with the measured values of the temperature sensors.

* * * * *